United States Patent
Prasad et al.

(10) Patent No.: US 7,231,586 B2
(45) Date of Patent: Jun. 12, 2007

(54) MULTI-RATE VITERBI DECODER

(75) Inventors: Mohit K. Prasad, Austin, TX (US);
Gaurav Davra, Uttar Pradish (IN);
Arnab K. Mitra, Uttar Pradish (IN);
Amrit P. Singh, Punjab (IN); Nitin Vig, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 413 days.

(21) Appl. No.: 10/896,268

(22) Filed: Jul. 21, 2004

(65) Prior Publication Data

US 2006/0020875 A1    Jan. 26, 2006

(51) Int. Cl.
*H03M 13/03* (2006.01)
(52) U.S. Cl. ............... 714/796; 714/795; 714/794
(58) Field of Classification Search ........... 714/796, 714/794, 795
See application file for complete search history.

(56) References Cited

U.S. PATENT DOCUMENTS 5,398,254 A * 3/1995 Miya et al. ............ 714/795
5,432,803 A * 7/1995 Liu et al. ............... 714/794
5,912,908 A   6/1999 Cesari et al.
5,946,361 A * 8/1999 Araki et al. ............ 375/341
6,477,680 B2 11/2002 Mujtaba

OTHER PUBLICATIONS

George C. Clark and J. Bibb Cain, "Error-Correction coding for Digital Communicatins", Plenum Press, 1981.*

* cited by examiner

*Primary Examiner*—Joseph D. Torres
(74) *Attorney, Agent, or Firm*—Charles Bergere

(57) ABSTRACT

A method and system for decoding a data symbol sequence that has been previously encoded using one or more unique code word polynomials in which at least one unique code word polynomial is used more than once. A set of $2^{d-1}$ unique branch metrics is computed, using the unique code word polynomials, where d is the number of unique code word polynomials. The computed set of $2^{d-1}$ unique branch metrics is stored in a memory. Path metrics are then calculated, based on the stored set of $2^{d-1}$ unique branch metrics. A decoded data symbol sequence is generated based on the computed path metrics.

6 Claims, 15 Drawing Sheets

| STATE | INPUT BIT | C0 | C1 | C2 | C3 | BRANCH METRIC |
|---|---|---|---|---|---|---|
| 0000 | 0 | 0 | 0 | 0 | 0 | S0+S1+S2+S3=BM0 |
| 0000 | 1 | 1 | 1 | 1 | 1 | −S0−S1−S2−S3=−BM0 |
| 0001 | 0 | 1 | 1 | 1 | 1 | −S0−S1−S2−S3=−BM0 |
| 0001 | 1 | 0 | 0 | 0 | 0 | S0+S1+S2+S3=BM0 |
| 0010 | 0 | 1 | 1 | 0 | 1 | −S0−S1+S2−S3=−BM1 |
| 0010 | 1 | 0 | 0 | 1 | 0 | S0+S1−S2+S3=BM1 |
| 0011 | 0 | 0 | 0 | 1 | 0 | S0+S1−S2+S3=BM1 |
| 0011 | 1 | 1 | 1 | 0 | 1 | −S0−S1+S2−S3=−BM1 |
| 0100 | 0 | 0 | 0 | 1 | 1 | S0+S1−S2−S3=BM2 |
| 0100 | 1 | 1 | 1 | 0 | 0 | −S0−S1+S2+S3=−BM2 |
| 0101 | 0 | 1 | 1 | 0 | 0 | −S0−S1+S2+S3=−BM2 |
| ⋮ | ⋮ | ⋮ | ⋮ | ⋮ | ⋮ | ⋮ |
| 1100 | 1 | 1 | 0 | 0 | 1 | −S0+S1+S2−S3=−BM6 |
| 1101 | 0 | 1 | 0 | 0 | 1 | −S0+S1+S2−S3=−BM6 |
| 1101 | 1 | 0 | 1 | 1 | 0 | S0−S1−S2+S3=BM6 |
| 1110 | 0 | 1 | 0 | 1 | 1 | −S0+S1−S2−S3=−BM7 |
| 1110 | 1 | 0 | 1 | 0 | 0 | S0−S1+S2+S3=BM7 |
| 1111 | 0 | 0 | 1 | 0 | 0 | S0−S1+S2+S3=BM7 |
| 1111 | 1 | 1 | 0 | 1 | 1 | −S0+S1−S2−S3=−BM7 |

*FIG. 8A*

| STATE | INPUT BIT | C0 | C1 | C2 | C3 | BRANCH METRIC |
|---|---|---|---|---|---|---|
| 0000 | 0 | 0 | 0 | 0 | 0 | S0+S1+S2+S3=BM0 |
| 0000 | 1 | 1 | 1 | 1 | 1 | −S0−S1−S2−S3=−BM0 |
| 0001 | 0 | 1 | 1 | 1 | 1 | −S0−S1−S2−S3=−BM0 |
| 0001 | 1 | 0 | 0 | 0 | 0 | S0+S1+S2+S3=BM0 |
| 0010 | 0 | 1 | 1 | 0 | 1 | −S0−S1+S2−S3=−BM1 |
| 0010 | 1 | 0 | 0 | 1 | 0 | S0+S1−S2+S3=BM1 |
| 0011 | 0 | 0 | 0 | 1 | 0 | S0+S1−S2+S3=BM1 |
| 0011 | 1 | 1 | 1 | 0 | 1 | −S0−S1+S2−S3=−BM1 |
| 0100 | 0 | 0 | 0 | 1 | 0 | S0+S1−S2+S3=BM1 |
| 0100 | 1 | 1 | 1 | 0 | 1 | −S0−S1+S2−S3=−BM1 |
| 0101 | 0 | 1 | 1 | 0 | 1 | −S0−S1+S2−S3=−BM1 |
| ⋮ | ⋮ | ⋮ | ⋮ | ⋮ | ⋮ | ⋮ |
| 1100 | 1 | 1 | 0 | 0 | 1 | −S0+S1+S2−S3=−BM3 |
| 1101 | 0 | 1 | 0 | 0 | 1 | −S0+S1+S2−S3=−BM3 |
| 1101 | 1 | 0 | 1 | 1 | 0 | S0−S1−S2+S3=BM3 |
| 1110 | 0 | 1 | 0 | 1 | 1 | −S0+S1−S2−S3=−BM2 |
| 1110 | 1 | 0 | 1 | 0 | 0 | S0−S1+S2+S3=BM2 |
| 1111 | 0 | 0 | 1 | 0 | 0 | S0−S1+S2+S3=BM2 |
| 1111 | 1 | 1 | 0 | 1 | 1 | −S0+S1−S2−S3=−BM2 |

*FIG. 8B*

| STATE | INPUT BIT | C0 | C1 | C2 | C3 | BRANCH METRIC |
|---|---|---|---|---|---|---|
| 0000 | 0 | 0 | 0 | 0 | 0 | S0+S1+S2+S3=BM0 |
| 0000 | 1 | 1 | 1 | 1 | 1 | −S0−S1−S2−S3=−BM0 |
| 0001 | 0 | 1 | 1 | 1 | 1 | −S0−S1−S2−S3=−BM0 |
| 0001 | 1 | 0 | 0 | 0 | 0 | S0+S1+S2+S3=BM0 |
| 0010 | 0 | 1 | 1 | 1 | 1 | −S0−S1−S2−S3=−BM0 |
| 0010 | 1 | 0 | 0 | 0 | 0 | S0+S1+S2+S3=BM0 |
| 0011 | 0 | 0 | 0 | 0 | 0 | S0+S1+S2+S3=BM0 |
| 0011 | 1 | 1 | 1 | 1 | 1 | −S0−S1−S2−S3=−BM0 |
| 0100 | 0 | 0 | 0 | 0 | 0 | S0+S1+S2+S3=BM0 |
| 0100 | 1 | 1 | 1 | 1 | 1 | −S0−S1−S2−S3=−BM0 |
| 0101 | 0 | 1 | 1 | 1 | 1 | −S0−S1−S2−S3=−BM0 |
| ⋮ | ⋮ | ⋮ | ⋮ | ⋮ | ⋮ | ⋮ |
| 1100 | 1 | 1 | 0 | 1 | 0 | −S0+S1−S2+S3=−BM1 |
| 1101 | 0 | 1 | 0 | 1 | 0 | −S0+S1−S2+S3=−BM1 |
| 1101 | 1 | 0 | 1 | 0 | 1 | S0−S1+S2−S3=BM1 |
| 1110 | 0 | 1 | 0 | 1 | 0 | −S0+S1−S2+S3=−BM1 |
| 1110 | 1 | 0 | 1 | 0 | 1 | S0−S1+S2−S3=BM1 |
| 1111 | 0 | 0 | 1 | 0 | 1 | S0−S1+S2−S3=BM1 |
| 1111 | 1 | 1 | 0 | 1 | 0 | −S0+S1−S2+S3=−BM1 |

*FIG. 8C*

| MEMORY LOCATION | BRANCH METRIC VALUE |
|---|---|
| F | $-S0-S1-S1-S3$ ($-BM0$) |
| E | $S0-S1-S2-S3$ ($BM7$) |
| D | $-S0+S1-S2-S3$ ($-BM1$) |
| C | $S0+S1-S2-S3$ ($BM6$) |
| B | $-S0-S1+S2-S3$ ($-BM2$) |
| A | $S0-S1+S2-S3$ ($BM5$) |
| 9 | $-S0+S1+S2-S3$ ($-BM3$) |
| 8 | $S0+S1+S2+S3$ ($BM4$) |
| 7 | $-S0-S1-S2+S3$ ($-BM4$) |
| 6 | $S0-S1-S2+S3$ ($BM3$) |
| 5 | $-S0+S1-S2+S3$ ($-BM5$) |
| 4 | $S0+S1-S2+S3$ ($BM2$) |
| 3 | $-S0-S1+S2+S3$ ($-BM6$) |
| 2 | $S0-S1+S2+S3$ ($BM1$) |
| 1 | $-S0+S1+S2+S3$ ($-BM7$) |
| 0 | $S0+S1+S2+S3$ ($BM0$) |

*FIG. 9A*

| MEMORY LOCATION | BRANCH METRIC VALUE |
|---|---|
| 7 | $-S0-S1-S1-S3$ ($-BM0$) |
| 6 | $S0-S1-S2+S3$ ($BM3$) |
| 5 | $-S0+S1-S2-S3$ ($-BM1$) |
| 4 | $S0+S1-S2+S3$ ($BM2$) |
| 3 | $-S0-S1+S2-S3$ ($-BM2$) |
| 2 | $S0-S1+S2+S3$ ($BM1$) |
| 1 | $-S0+S1+S2-S3$ ($-BM3$) |
| 0 | $S0+S1+S2+S3$ ($BM0$) |

*FIG. 9B*

| MEMORY LOCATION | BRANCH METRIC VALUE |
|---|---|
| 3 | $-S0-S1-S1-S3$ ($-BM0$) |
| 2 | $S0-S1+S2+S3$ ($BM1$) |
| 1 | $-S0+S1-S2-S3$ ($-BM1$) |
| 0 | $S0+S1+S2+S3$ ($BM0$) |

*FIG. 9C*

| MEMORY LOCATION | BRANCH METRIC VALUE |
|---|---|
| 7 | S0−S1−S2−S3 (BM7) |
| 6 | S0+S1−S2−S3 (BM6) |
| 5 | S0−S1+S2−S3 (BM5) |
| 4 | S0+S1+S2−S3 (BM4) |
| 3 | S0−S1−S2+S3 (BM3) |
| 2 | S0+S1−S2+S3 (BM2) |
| 1 | S0−S1+S2+S3 (BM1) |
| 0 | S0+S1+S2+S3 (BM0) |

*FIG. 10A*

| MEMORY LOCATION | BRANCH METRIC VALUE |
|---|---|
| 3 | S0−S1−S2+S3 (BM3) |
| 2 | S0+S1−S2+S3 (BM2) |
| 1 | S0−S1+S2+S3 (BM1) |
| 0 | S0+S1+S2+S3 (BM0) |

*FIG. 10B*

| MEMORY LOCATION | BRANCH METRIC VALUE |
|---|---|
| 1 | S0−S1+S2+S3 (BM1) |
| 0 | S0+S1+S2+S3 (BM0) |

*FIG. 10C*

MULTI-RATE VITERBI DECODER

BACKGROUND OF THE INVENTION

The present invention relates to digital communication systems. In particular, the present invention relates to the decoding of a convolutionally encoded data symbol sequence in a digital communication system.

Various error detection and correction techniques are used to increase the reliability of a communication system. The techniques involve the encoding of the transmitted data symbol sequence and the decoding of the received encoded data symbol sequence.

One such encoding technique is channel encoding. Channel encoding involves the addition of carefully designed redundant information to the data symbol sequence being transmitted through the channel. The received encoded data symbol sequence on the receiver side is then decoded to obtain the original data symbol sequence. Convolutional coding is one such form of channel coding. Convolutional coding is used to introduce redundancies in the transmitted data. The transmitter sends convolutionally encoded data rather than the transmitted data across a noisy channel. The receiver receives the convolutionally encoded data symbol sequence along with the errors, and corrects these errors in the decoding process.

A convolutional code is a sequence of encoded symbols, which is generated by passing the information sequentially through a series of binary shift registers. For example, if a 1/r code rate convolutional coding is used, then each input bit is encoded into r bits of data. The encoded bits are generated using code word polynomials and a binary shift register defined by constraint length, K.

Once encoded, the resulting code is modulated and transmitted across the noisy channel. On the receiver side, the encoded data is demodulated before being decoded.

There are various algorithms for decoding convolutionally encoded data. The Viterbi algorithm is one such technique used in the art. The Viterbi algorithm decodes a convolutionally encoded data symbol sequence using the prior knowledge of the possible encoder state transitions from a given state to the next state. The prior knowledge is based on the dependence of a given data state on past data. The allowable state transitions can be represented using a trellis diagram. Each node in the trellis diagram denotes the state of a data symbol sequence at a point in time. The branches connecting the nodes denote the state transitions.

The Viterbi decoding process has three basic steps. In the first step, the received data symbol is processed to determine the Euclidean distance between the received data symbol sequence and all possible actual data symbol sequences that could result from a state transition from the present to a next state. This result is stored in a memory for use during the next step. The Euclidean distance computed also is referred to as the branch metric for the path. The branch metric computation provides a measurement of the likelihood that a given path from the present state to a next state is correct.

In the second step, the stored branch metric values for all possible state transitions are processed to determine an "accumulated distance" for each input path. The path with the minimum distance, i.e., maximum probability, is then selected as the survivor path. This step is known as Add-Compare-Select, or ACS. The ACS operation can be broken into two operations, the Add operation involving a path metric computation, and a Compare-Select operation. The path metric at a stage is the accumulation of the accumulated error metric resulting from previous branch metric computations and the branch metric values for a received data input symbol. The accumulated error metric values are computed from the Add operation, to determine and store the "trace-back bits" to indicate the selected survivor path.

The third step is known as trace-back. This step traces the maximum likelihood path through the trellis of state transitions, as determined by the first two steps, and reconstructs the most likely path through the trellis, to extract the original data input to the encoder.

Conventional implementations, for an encoder of code rate r, typically compute all $2^r$ branch metrics for a given data input symbol at any stage of a decoding process and store the entire branch metric set in memory. This technique requires a minimum of $2^r$ calculations, which consumes a large number of machine cycles. Further, storing the entire $2^r$ branch metrics uses a relatively large amount of memory. A large memory requirement together with a large number of machine cycles for decoding increases the power requirements of the decoder. Additionally, the die-area of the chip used to implement the decoder must be large to accommodate the large memory required.

Hence, there is a need for a method and system that reduces the computational complexity of the decoding technique, thereby reducing memory requirements and the system delay associated with the method of decoding. Further, there is a need for a method and system that reduces the power consumed in decoding the received data and for one that reduces the die-size of the chip implementing the decoder.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

FIG. 8A is a table showing the computed branch metric values in a ¼ code rate data symbol sequence, where none of the code word polynomials are re-used;

FIG. 8B is a table showing the computed branch metric values in a ¼ code rate data symbol sequence, where one code word polynomial is re-used;

FIG. 8C is a table showing the computed branch metric values in a ¼ code rate data symbol sequence, where two code word polynomials are re-used;

FIG. 9A is a table showing the $2^d$ branch metrics stored in memory, computed by not re-using any of the code word polynomials, in accordance with an exemplary embodiment of the present invention;

FIG. 9B is a table showing the $2^d$ branch metrics stored in the memory, computed by re-using one code word polynomial, in accordance with an exemplary embodiment of the present invention;

FIG. 9C is a table showing the $2^d$ branch metrics stored in the memory, computed by re-using two code word polynomials, in accordance with an exemplary embodiment of the present invention;

FIG. 10A is a table showing the $2^{(d-1)}$ branch metrics stored in the memory, computed by not re-using any of the code word polynomials, in accordance with an exemplary embodiment of the present invention;

FIG. 10B is a table showing the $2^{(d-1)}$ branch metrics stored in the memory, computed by re-using one code word polynomial, in accordance with an exemplary embodiment of the present invention;

FIG. 10C is a table showing the $2^{(d-1)}$ branch metrics stored in the memory, computed by re-using two code word polynomials, in accordance with an exemplary embodiment of the present invention;

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method and system to decode a data symbol sequence that has been previously encoded, using one or more unique code word polynomials. The encoding process uses at least one unique code word polynomial more than once. The first step of the decoding method is the computation of a set of unique branch metrics, using the unique code word polynomials. The number of branch metrics that needs to be computed in the method is $2^{(d-1)}$, where d is the number of unique code word polynomials. The computed set of branch metrics is then stored. The stored branch metrics are used to compute a set of path metrics. Based on the path metrics, a set of decoded data symbol sequences is generated.

The system for implementing the method described above is a Viterbi decoder comprising a branch metric unit to compute the unique branch metrics, a first memory to store the computed unique branch metrics, a path metric unit to compute the set of path metrics, and a trace back unit to generate the decoded data symbol sequence, based on the computed path metrics.

Figure 1:
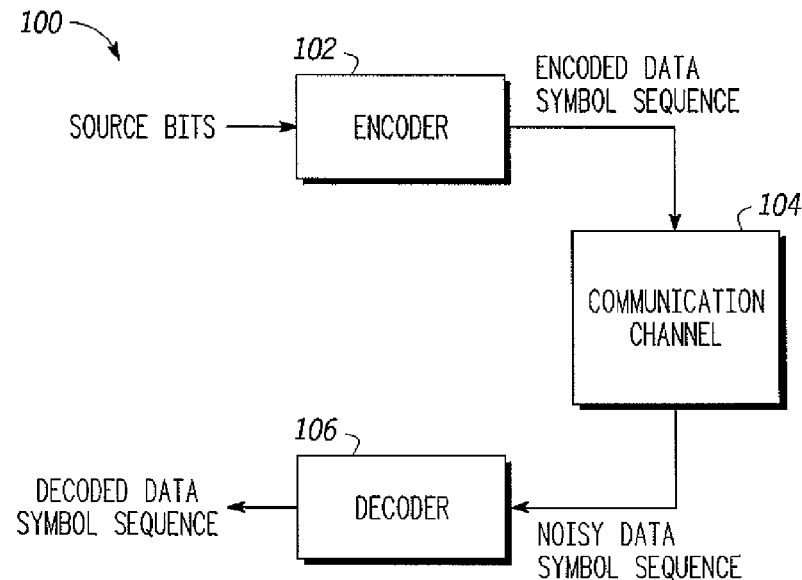
FIG. 1 is a block diagram of a communication system in accordance with an exemplary embodiment of the present invention.

Referring now to FIG. 1, a block diagram of a communication system 100 in accordance with the present invention is shown. The communication system comprises an encoder 102, a communication channel 104 and a Viterbi decoder 106. The encoder 102 encodes source bits and generates an encoded data symbol sequence. The encoded data symbol sequence is transmitted over the communication channel 104 to the decoder 106. The communication channel 104 can be either a wired or wireless channel. A noise component is introduced into the data symbol sequence while it is being transmitted over the communication channel 104. The noise component can be sufficiently large in magnitude to modify the encoded data symbol sequence. The decoder 106 receives the data symbol sequence and performs appropriate steps to generate a decoded data symbol sequence.

Figure 2:
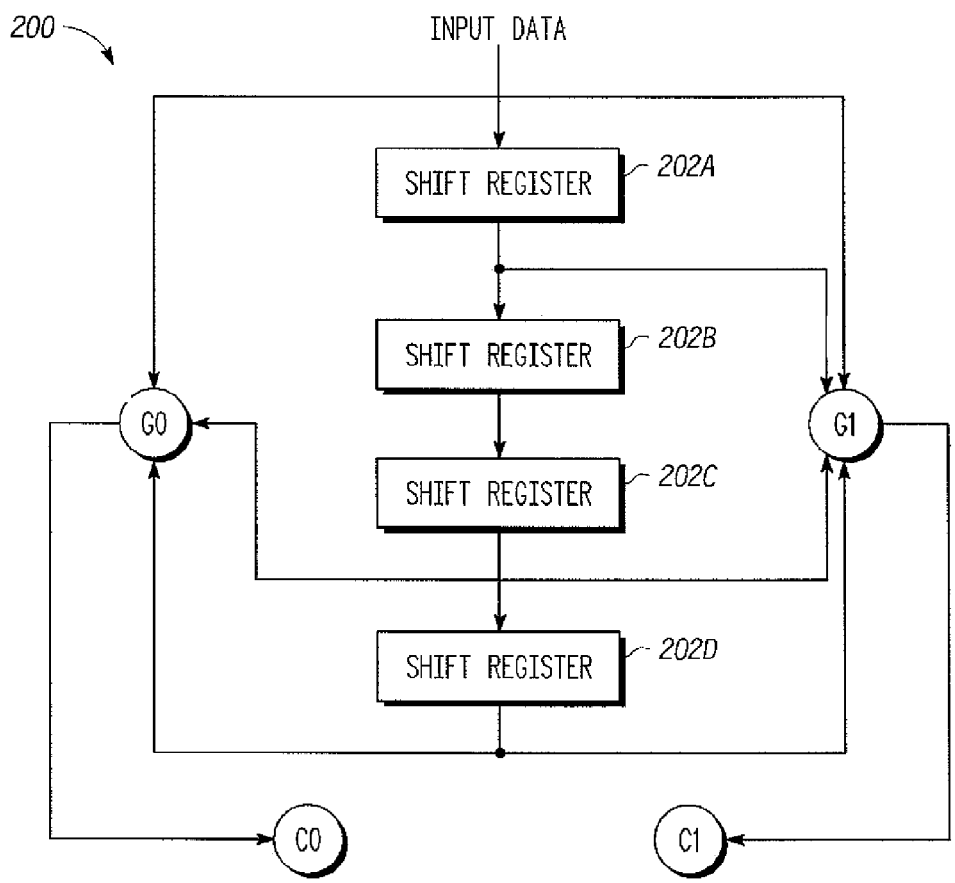
FIG. 2 is a block diagram of a circuit to generate encoded bits at the encoder.

FIG. 2 is a block diagram of a circuit 200 for generating encoded bits at the encoder 102. The circuit 200 is capable of generating two encoded bits corresponding to each input bit. The circuit 200 comprises shift registers 202a, 202b, 202c and 202d. The shift registers 202a, 202b, 202c and 202d are used to generate the encoded data symbol sequence. For example, an encoded bit C0 is generated by adding the input of shift register 202a, and the input and the output of shift register 202d. The selection of shift registers and their connection depends on the choice of code word polynomials used for encoding. The code word polynomials are user-programmable. That is, it is possible to select the code word polynomials based on user requirement. Further, the user specifies the order in which the codeword polynomials are used to encode the input bit. In an embodiment of the present invention, the code word polynomials are selected on the basis of the convolutional coding technique. Alternatively, encoding can be conducted by selecting code word polynomials based on any repeated coding technique.

Figure 3:
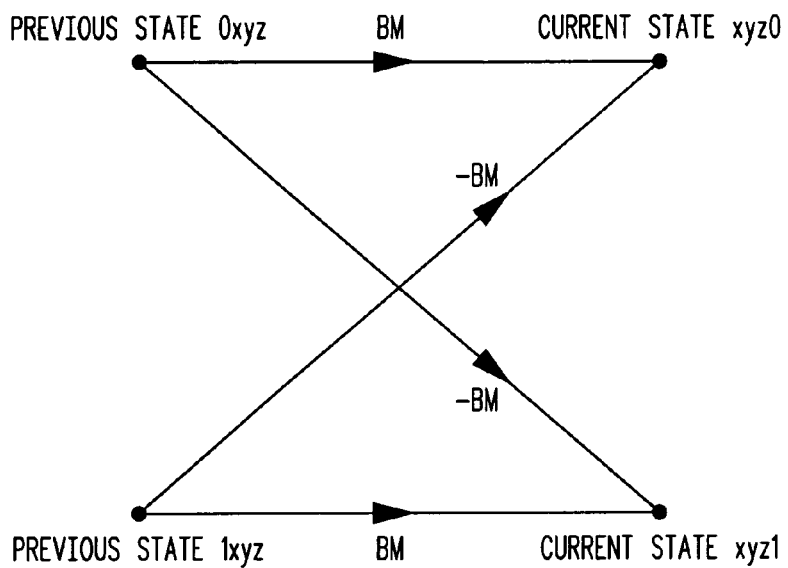
FIG. 3 illustrates a Viterbi butterfly showing the transition from one trellis state to another trellis state.

For the purpose of understanding the present invention, a Viterbi butterfly depicting transitions from one trellis state to another trellis state is illustrated at FIG. 3. As shown in FIG. 3, the Viterbi butterfly depicts the transitions that occur from previous states 0xyz and 1xyz to current states xyz0 and xyz1. In the process of transition from the previous state to the current state, a current state can be reached for an input bit of 0 or 1.

Figure 4:
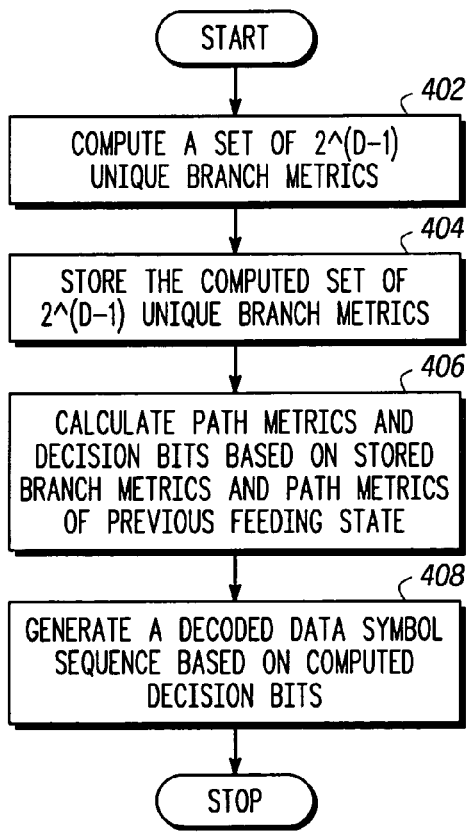
FIG. 4 is a flowchart illustrating a method for decoding a data symbol sequence in accordance with an exemplary embodiment of the present invention.

FIG. 4 is a flowchart illustrating a method of decoding a data symbol sequence in accordance with an exemplary embodiment of the present invention. At step 402, a set of $2^{(d-1)}$ unique branch metrics is computed by processing the received encoded data symbol sequence, where d is the number of unique code word polynomials used for the decoding process. The decoding process involves computing a set of $2^d$ branch metrics, and further processing the computed set to generate a set of $2^{(d-1)}$ unique branch metrics. The steps to generate the set of $2^{(d-1)}$ unique branch metrics are further elaborated in conjunction with FIG. 5. The computed set of $2^{(d-1)}$ unique branch metrics is stored at step 404. At step 406, path metrics and decision bits are calculated, using the stored branch metrics. Step 406 is described in detail in conjunction with FIG. 5. At step 408, a decoded data symbol sequence is generated, based on the computed decision bits.

Figure 5:
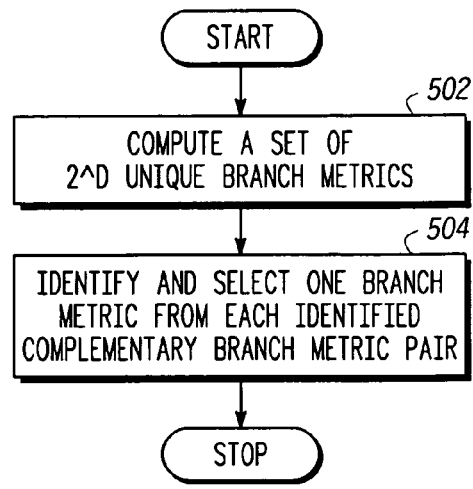
FIG. 5 is a flowchart illustrating the steps performed to compute $2^{(d-1)}$ branch metrics at step 402 of FIG. 4, in accordance with an exemplary embodiment of the present invention.

FIG. 5 is a flowchart illustrating the steps performed to compute $2^{(d-1)}$ branch metrics at step 402 of FIG. 4, in accordance with an exemplary embodiment of the present invention. At step 502, a set of unique branch metrics is computed, where the number of branch metrics is $2^d$. Subsequently, at step 504, complementary branch metric pairs from amongst the computed set of $2^d$ unique branch metrics are identified and selected. This involves selecting a branch metric from each identified complementary branch metric pair. The selected branch metrics subsequently are stored at step 404.

Figure 6:
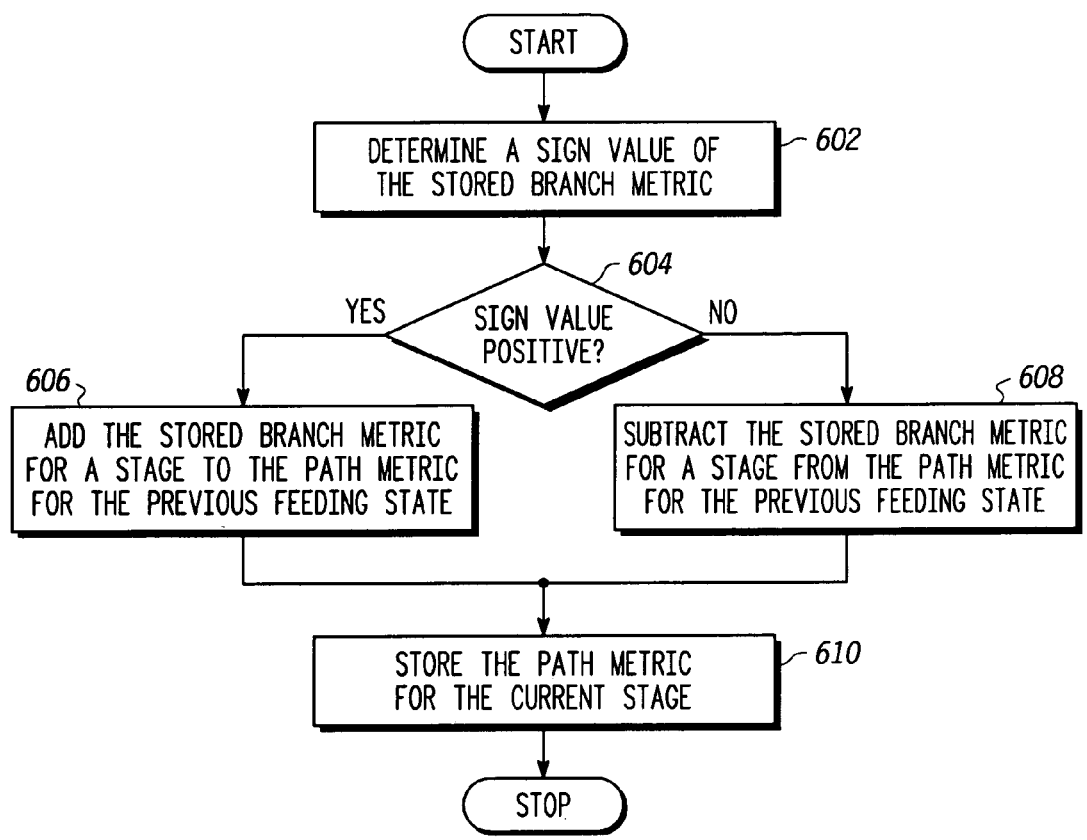
FIG. 6 is a flowchart illustrating the steps performed to compute the path metrics for a trellis state in accordance with an exemplary embodiment of the present invention.

FIG. 6 is a flowchart illustrating the method steps performed to compute the path metrics for a trellis state in accordance with an exemplary embodiment of the present invention. At step 602, the sign value of the stored branch metrics is determined. Then, at step 604, a check is made to identify whether the sign value is positive or negative. If the sign value of the stored branch metric is positive, the stored branch metric for the trellis state is added to the path metric of the feeding trellis state at step 606, to generate the path metric for the trellis state. If the sign value of the stored branch metric is negative, the stored branch metric for the trellis state is subtracted from the path metric of the feeding trellis state at step 608, to generate the path metric for the trellis state. After generating the path metrics for the trellis state, the smallest path metric along with the decision bit at the trellis state is identified. The smallest identified path metric is stored at step 610. The decoded data symbol sequence is then generated, based on these stored smallest path metrics and decision bits.

Figure 7:
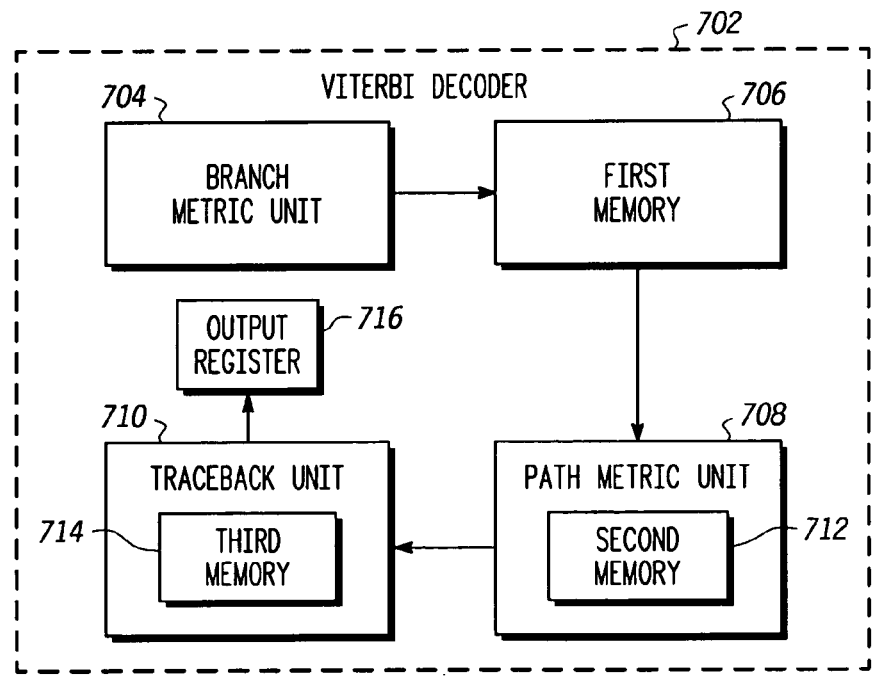
FIG. 7 is a block diagram illustrating a Viterbi decoder in accordance with an exemplary embodiment of the present invention.

FIG. 7 is a block diagram illustrating a Viterbi decoder 702 in accordance with an exemplary embodiment of the present invention. The Viterbi decoder 702 comprises a branch metric unit 704, a first memory 706, a path metric unit 708 that includes a second memory 712, a trace back unit 710 that includes a third memory 714 and an output register 716. The branch metric unit 704 computes a set of $2^{(d-1)}$ unique branch metrics using the unique code word polynomials. The branch metric unit 704 is described in more detail in conjunction with FIG. 11. The first memory 706 is connected to the branch metric unit 704 and stores the computed set of $2^{(d-1)}$ unique branch metrics. The path metric unit 708 is connected to the first memory 706 and calculates the path metrics using the set of $2^{(d-1)}$ unique branch metrics stored in the first memory 706. The trace back unit 710 is connected to the path metric unit 708 and generates the decoded data symbol sequence using the decision bits. The second memory 712 stores the path metric values calculated by the path metric unit 708. The third memory 714 stores the decision bits calculated by the trace back unit 710. The output register 716 stores the decoded data symbol sequence generated by the trace back unit 710. In an embodiment of the present invention, each of the first memory 706, second memory 712, and third memory 714 is a Random Access Memory (RAM).

One advantage of the present invention is that the size of the first memory 706 is smaller than the memory required in a conventional decoder. For a rate of 1/r, constraint length K Viterbi decoder, a conventional decoder pre-computes the branch metrics at each trellis stage and stores the computed branch metrics corresponding to each of the $2^r$ different branch metric values. Thus, the number of branch metrics that are computed and stored in the conventional decoder is $2^r$. In contrast, since only one of a pair of branch metrics is stored, and only for unique code word polynomials, the number of branch metrics stored in accordance with the present invention is $2^{(d-1)}$, where d is the number of unique code polynomials.

For example, in GSM/GPRS and EDGE Radio Access Networks (GERAN), a code rate of 10 and constraint length K=5 and 7, the code rate is 1/r where r=2, 3, 4, 5, 6, 7, 8 and 10, the pre-compute and store method of the conventional decoder stores $2^{10}$ or 1024 branch metrics. In contrast, only eight branch metrics are stored in an embodiment of the present invention because the present invention takes into account the specific number of encoder polynomials in GERAN.

For the purpose of illustrating the operation of the present invention, the code word polynomials used for encoding purposes are $G0=1+D^3+D^4$, $G1=1+D+D^3+D^4$, $G2=1+D+D^4$ and $G3=1+D+D^2+D^3+D^4$. However, it will be apparent to a person skilled in the art that code word polynomials other than those mentioned above could be used, without diverting from the scope of the invention. Further, the present invention is generalized to all cases where the number of encoder polynomials is less than the maximum value of r in systems with minimum code rate k/r, for some k. These advantages are further illustrated using FIGS. 8A, 8B, 8C, 9A, 9B, 9C, 10A, 10B and 10C.

FIG. 8A is a table showing the computed branch metric values in a ¼ code rate data symbol sequence, where no code word polynomial is re-used. In particular, four codeword polynomials, G0, G1, G2 and G3 are used to generate four encoded bits, in response to an input bit. The table in FIG. 8A comprises columns corresponding to state, input bit, encoded bits and branch metrics. Elements in the 'State' column define the current state of the decoder 502. Column 'Input bit' contains the received input bit in the decoder 502. Columns C0, C1, C2, and C3 illustrate the four encoded bits. Encoded bit C0 is generated by the codeword polynomial G0. C1 is generated by G1, C2 is generated by G2, and C3 is generated by G3. The elements of column 'Branch Metric' correspond to the branch metrics computed based on the input bit, encoded bit, and the current state. The table in FIG. 8A illustrates the possible branch metrics corresponding to the possible input states, input bit and the encoded bits. As illustrated in the table, there are 16 possible branch metric values for each input bit, i.e., either '1' or '0'.

FIG. 8B is a table showing the computed branch metric values in a ¼ code rate data symbol sequence, wherein one code word polynomial is re-used. In this case, three codeword polynomials, G0, G1 and G2, are used to generate four encoded bits, in response to an input bit. Consequently, there are 8 possible branch metric values for each input bit, i.e., '1' or '0'. Encoded bits C0 and C3 are generated by the codeword polynomial G0. C1 is generated by G1, while C2 is generated by G2. Since both C0 and C3 are generated by G0, they are identical in all rows of the table. Consequently, the number of unique branch metrics is half of the total number of branch metrics. For example, the first and the fourth elements of column 'Branch Metric' are identical. As a result, only one of them is selected for storage. In this way, the number of unique branch metrics that are stored in memory is reduced.

FIG. 8C is a table showing the computed branch metric values in a ¼ code rate data symbol sequence, wherein two code word polynomials are re-used. In this case, two codeword polynomials, G0 and G1 are used to generate four encoded bits, in response to an input bit. Consequently, there are 4 possible branch metric values for each input bit, i.e., '1' or '0'. Encoded bits C0 and C2 are generated by the codeword polynomial G0. C1 is generated by G1, while C1 and C3 are generated by G1. Since both C0 and C2 are generated by G0, they are identical in all rows of the table. Also, as C1 and C3 are generated by G1, they are identical in all rows of the table. Since the elements of columns C0 and C2 are identical, the number of unique branch metrics is half of the total number of branch metrics. Also, since the elements of columns C1 and C3 are identical, the number of unique branch metrics is further halved.

FIG. 9A is a table showing the $2^d$ branch metrics stored in the memory, computed by re-using none of the code word polynomials, in accordance with an exemplary embodiment of the present invention. The table in FIG. 9A shows columns 'Memory Location' and 'Branch Metric Value'. Each element in column 'Memory Location' shows the address of a memory location in the first memory 706, while the column 'Branch Metric Value' contains the branch metric value stored in the corresponding memory location. For example, memory location F stores branch metric value -BMO. As none of the code word polynomials was re-used, there are 16 unique branch metric values for each input bit. Eight of these 16 unique branch metrics are complementary to the other eight. In an embodiment of the present invention, only eight of these unique branch metrics are stored in the first memory 706.

FIG. 9B is a table showing the $2^d$ branch metrics stored in the memory, computed by re-using one code word polynomial, in accordance with an exemplary embodiment of the present invention. While the number of possible branch metrics illustrated in table in FIG. 9A is 16, the number of unique branch metrics illustrated in table in FIG. 9B is eight. This is because of the re-use of one of the code word polynomials. Hence, eight memory locations are required instead of 16. Hence, the size of the first memory 706 is reduced by a factor of two if a code word polynomial is re-used.

FIG. 9C is a table showing the $2^d$ branch metrics stored in the memory, computed by re-using two code word polynomials, in accordance with an exemplary embodiment of the present invention. While the number of possible branch metrics illustrated in the table in FIG. 9A is 16, the number of branch metrics in the table in FIG. 9B is eight, the number of unique branch metrics illustrated in the table in FIG. 9C is four. Hence, only four memory locations are required for storing these branch metrics. Hence, the size of the first memory 706 is further reduced by a factor of two by re-using two code word polynomials.

To summarize, redundancy in the code word polynomials leads to a redundancy in the branch metrics generated. The present invention identifies the redundant branch metrics, selects one among the redundant branch metrics, and stores the selected branch metrics. Reduction in the branch metrics that need to be stored leads to a reduction in the size of the first memory 706.

In another embodiment of the present invention, the number of branch metrics stored in the first memory 706 is further reduced by a factor of two by identifying complementary branch metric pairs from amongst the computed $2^d$ branch metrics, shown in FIGS. 9A, 9B and 9C, and only storing one branch metric from the identified pair. This is described in detail in conjunction with FIGS. 10A, 10B and 10C.

FIG. 10A is a table showing the $2^{(d-1)}$ branch metrics to be stored in the memory, computed by not re-using any code word polynomial, in accordance with an exemplary embodiment of the present invention. Sixteen unique branch metrics were obtained when none of the four code word polynomials is re-used. The computed branch metrics are depicted in the table in FIG. 9A. Amongst these 16 branch metrics, eight branch metrics are complementary to the other eight branch metrics. Hence, after identification of all such complementary branch metric pairs from the table in FIG. 9A, only eight branch metrics are stored in the first memory 706, as shown in the table in FIG. 10A. The removal of complementary branch metrics from the initially computed 16 branch metrics reduces the required size of the first memory to eight memory locations instead of 16 in the embodiment where none of the code word polynomials is re-used.

FIG. 10B is a table showing the $2^{(d-1)}$ branch metrics to be stored in the memory, computed by re-using one code word polynomial, in accordance with an exemplary embodiment of the present invention. Eight unique branch metrics are obtained by re-using one code word polynomial. The computed branch metrics are depicted in table in FIG. 9B. From amongst these eight branch metrics, four branch metrics are complementary to the other four branch metrics. Hence, after the identification of all such complementary branch metric pairs from the table in FIG. 9B, only four branch metrics are stored in the first memory 706, as shown in table in FIG. 10B. The removal of complementary branch metrics from the initially computed eight branch metrics reduces the size of the first memory 706 to four memory locations.

FIG. 10C is a table showing the $2^{(d-1)}$ branch metrics to be stored in the memory, computed by re-using two code word polynomials, in accordance with an exemplary embodiment of the present invention. Four unique branch metrics are obtained if two code word polynomials are re-used. The computed branch metrics are shown in table in FIG. 9C. From amongst these four branch metrics, two branch metrics are complementary to the other two branch metrics. Hence, after identification of all such complementary branch metric pairs from the table in FIG. 9C, only two branch metrics are stored in the first memory 706, as shown in table in FIG. 10C. The removal of complementary branch metrics from the initially computed four branch metrics reduces the required size of the first memory 706 to two memory locations.

The implementation of the method described above involves the step of encoding, using the code word polynomials. This is performed by a selection of one or more code word polynomials and using them to generate the encoded data symbol sequence. A system for selecting code word polynomials and generating the encoded bits, using the same, is hereinafter described.

Figure 11A:
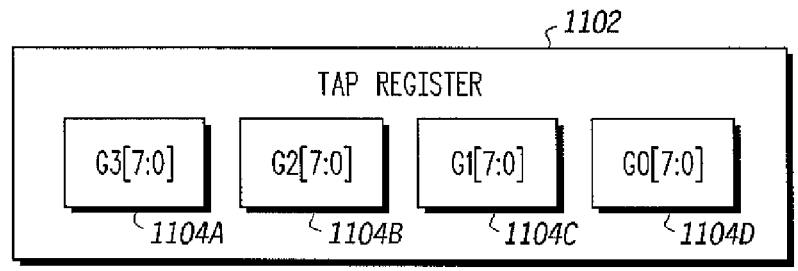
FIG. 11A is a block diagram of a tap register used to determine the codeword polynomials.
Figure 11B:
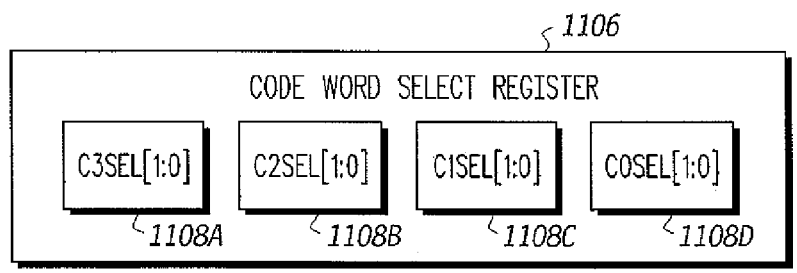
FIG. 11B is a block diagram of a code word select register used to select codeword polynomials for encoding

FIGS. 11A and 11B are block diagrams illustrating sets of tap and code word select registers for the case of ¼ code rate encoded data symbol sequence. The taps and code word select registers are used to determine the codeword polynomials and the selection of those code word polynomials for encoding. The configuration of the shift registers 202a, 202b, 202c and 202d (FIG. 2) is user programmed to change the code word polynomials. A tap register 1102 comprises eight-bit-wide polynomials G3[7:0] 1104a, G2[7:0] 1104b, G1[7:0] 1104c and G0[7:0] 1104d. The bits of these eight-bit-wide polynomials contain information about the code word polynomial. The connections of the shift registers 202a, 202b, 202c and 202d are determined by the bit values stored in the tap register 1102. The connections of the shift registers 202a, 202b, 202c and 202d can be altered to generate a new code word polynomial by modifying the contents of the tap register 1102. For example, for a constraint length K=5, if G0[7:0] 1104d has the value '00000101', then the selected code word polynomial equals 1+D+D^3+D^4, where 1 represents the input signal, D represents the output of shift register 202a, and D^3 represents output of shift register 202c. If G0[7:0] 1104d has a value '00000110', then the selected code word polynomial equals 1+D^2+D^3+D^4, where D^2 represents the output of the shift register 202b and D^3 represents the output of the shift register 202c. Hence, the unique code word polynomials can be user programmed by changing the contents of the tap register 1102. It is to be noted that the number of tap registers is the same as the number of code word polynomials used for encoding.

A code word select register 1106 has two 2-bit-wide code word select registers C3sel[1:0] 1108a, C2sel[1:0] 1108b, C1sel[1:0] 1108c and C0sel[1:0] 1108d. The contents of the 2-bit-wide code word select registers 1108a, 1108b, 1108c and 1108d determine the code word polynomials used to encode the input data. In an embodiment of the present invention, if the 2-bit-wide code word select register C1sel[1:0] 1108c contains the value 00, then the code word polynomial G0 1104d is selected. To re-use the same code word polynomial G0 1104d for encoding, '00' is also stored in the code word select register C0sel[1:0] 1108d. Hence, re-use of a code word polynomial is achieved by using the code word select registers C1sel[1:0] 1108c and C0sel[1:0] 1108d. It is to be noted that the number of code word select registers is same as the number of code word polynomials used for encoding.

Figure 12:
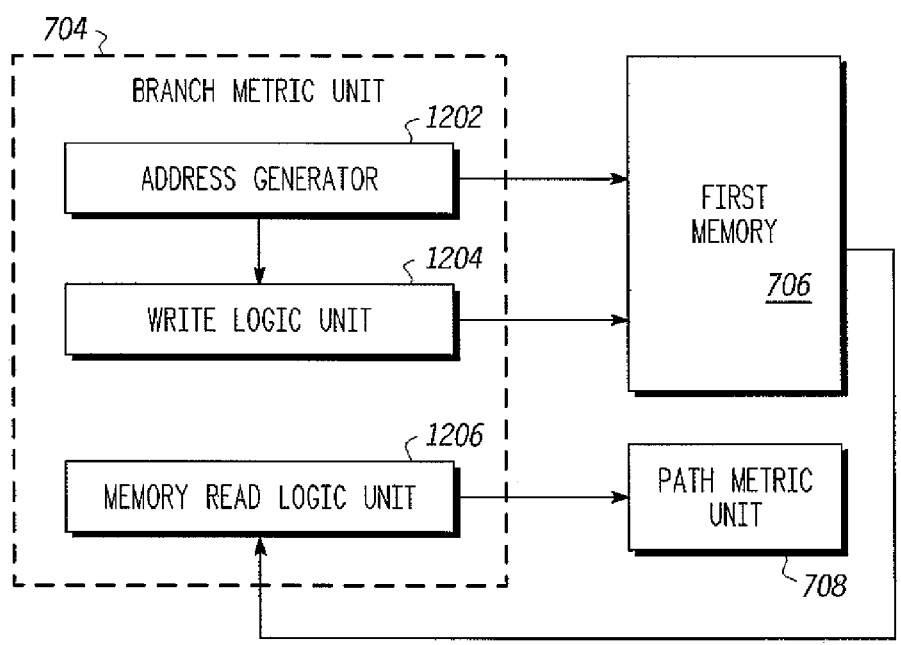
FIG. 12 is a block diagram of a branch metric unit in accordance with an exemplary embodiment of the present invention.

FIG. 12 is a block diagram of a branch metric unit 604 in accordance with an embodiment of the present invention. The branch metric unit 704 comprises an address generator 1202 to generate the addresses for computing and populating branch metrics, a write logic unit 1204 and a memory read logic unit 1206. The address generator 1202 is connected to the write logic unit 1204 and first memory 706. The address generator 1202 is described in detail in conjunction with FIGS. 13A and 13B. The write logic unit 1204 is connected to the first memory 706 and provides the branch metric values stored in the first memory 706. The computed branch metrics are stored in the first memory 706 at a memory location, whose address is provided by the address generator 1202. The write logic unit 1204 is involved in the computation of the branch metrics. In particular, the write logic unit 1204 identifies the complementary branch metrics from amongst the computed set of 2^(d) unique branch metrics. The memory read logic unit 1206 is connected to the output of the first memory 706. The memory read logic unit 1206 also is connected to the path metric unit 708 and reads the stored branch metrics from the first memory 706 and passes them to the path metric unit 708. The memory read logic unit 1206 is described in detail in conjunction with FIGS. 14A and 14B.

Figure 13A:
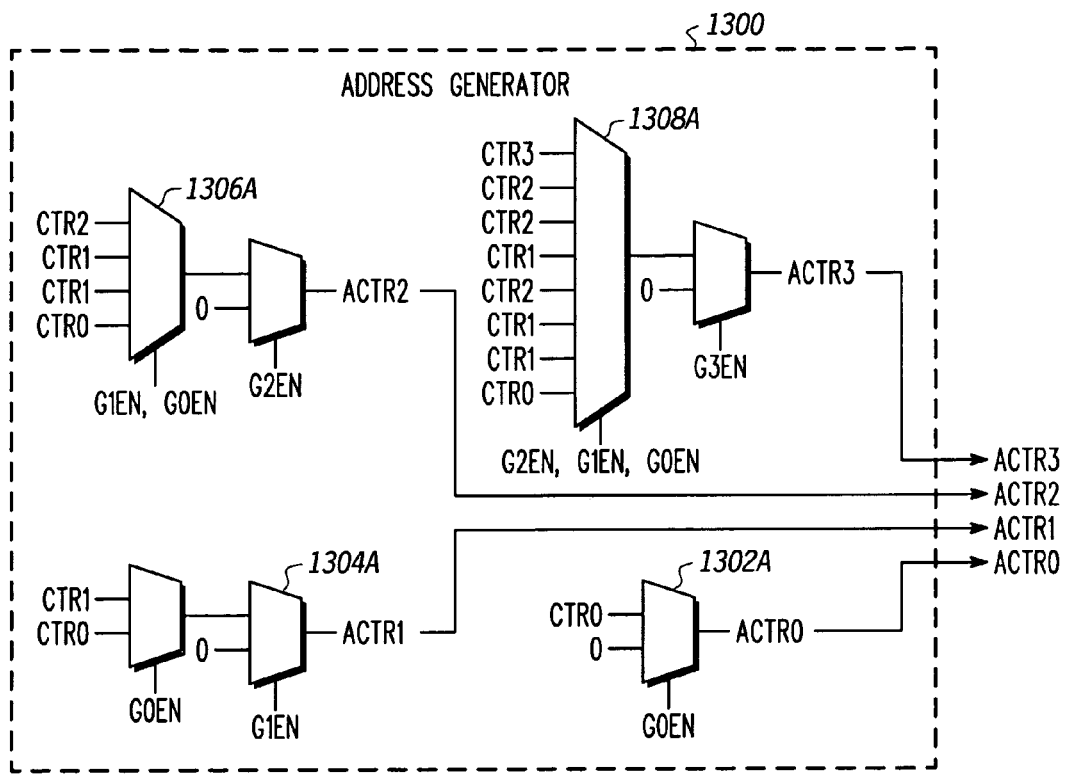
FIG. 13A is a block diagram of an address generator used to compute $2^d$ branch metrics in accordance with an exemplary embodiment of the present invention.

FIG. 13A is a block diagram illustrating an address generator, used to compute the addresses for storing 2^d branch metrics, in accordance with an embodiment of the present invention. In this embodiment, an address generator 1300 is a variant of the address generator 1202. The address generator 1300 generates a 4-bit address counter actr[3:0], which is used to populate the first memory 706 with the computed set of unique branch metrics. The four bits of address counter actr[3:0] are generated by four address bit generators actr0 generator 1302a, actr1 generator 1304a, actr2 generator 1306a and actr3 generator 1308a. In an embodiment of the present invention, each of the address bit generators comprises a multiplexer. The inputs to each multiplexer are derived from a 4-bit counter ctr[3:0]. The control signals for the multiplexers are derived from the tap registers 1102. For example, the inputs to actr0 generator 1302a are generated from the counter ctr[3:0], while the control signal is determined from the tap register 1104a. The output of the address generator 1300, actr[3:0], is an address that is used in computing and populating branch metrics, described in detail in conjunction with FIG. 14A.

Figure 13B:
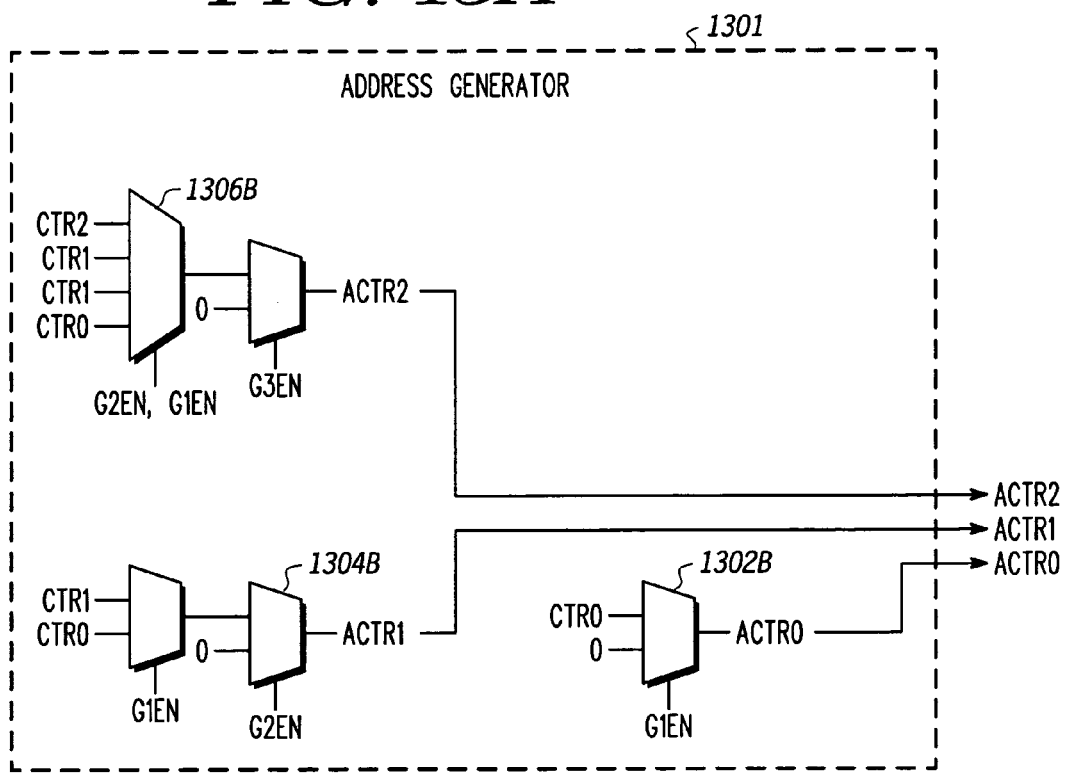
FIG. 13B is a block diagram of an address generator used to compute $2^{(d-1)}$ branch metrics in accordance with an exemplary embodiment of the present invention.

FIG. 13B is a block diagram of an address generator 1301, used to compute 2^(d-1) branch metrics, in accordance with an embodiment of the present invention. In this embodiment, the address generator 1301 is a variant of the address generator 1202. The address generator 1301 generates a 3-bit address counter actr[2:0], which is used to populate the first memory 706 with the computed set of unique branch metrics. The three bits of the address counter actr[2:0] are generated by three address bit generators actr0 generator 1302b, actr1 generator 1304b and actr2 generator 1306b. In an embodiment of the present invention, each of the address bit generators comprises a multiplexer. The inputs to each multiplexer are derived from a 3-bit counter ctr[2:0]. The control signals for the multiplexers are derived from the tap registers 1102. For example, the inputs to actr0 generator 1302b are generated from counter ctr[2:0], while the control signal is determined from the tap register 1104a. The output of the address generator 1301, actr[2:0], is an address that is used in computing and populating branch metrics, described in detail in conjunction with FIG. 14B.

Figure 14A:
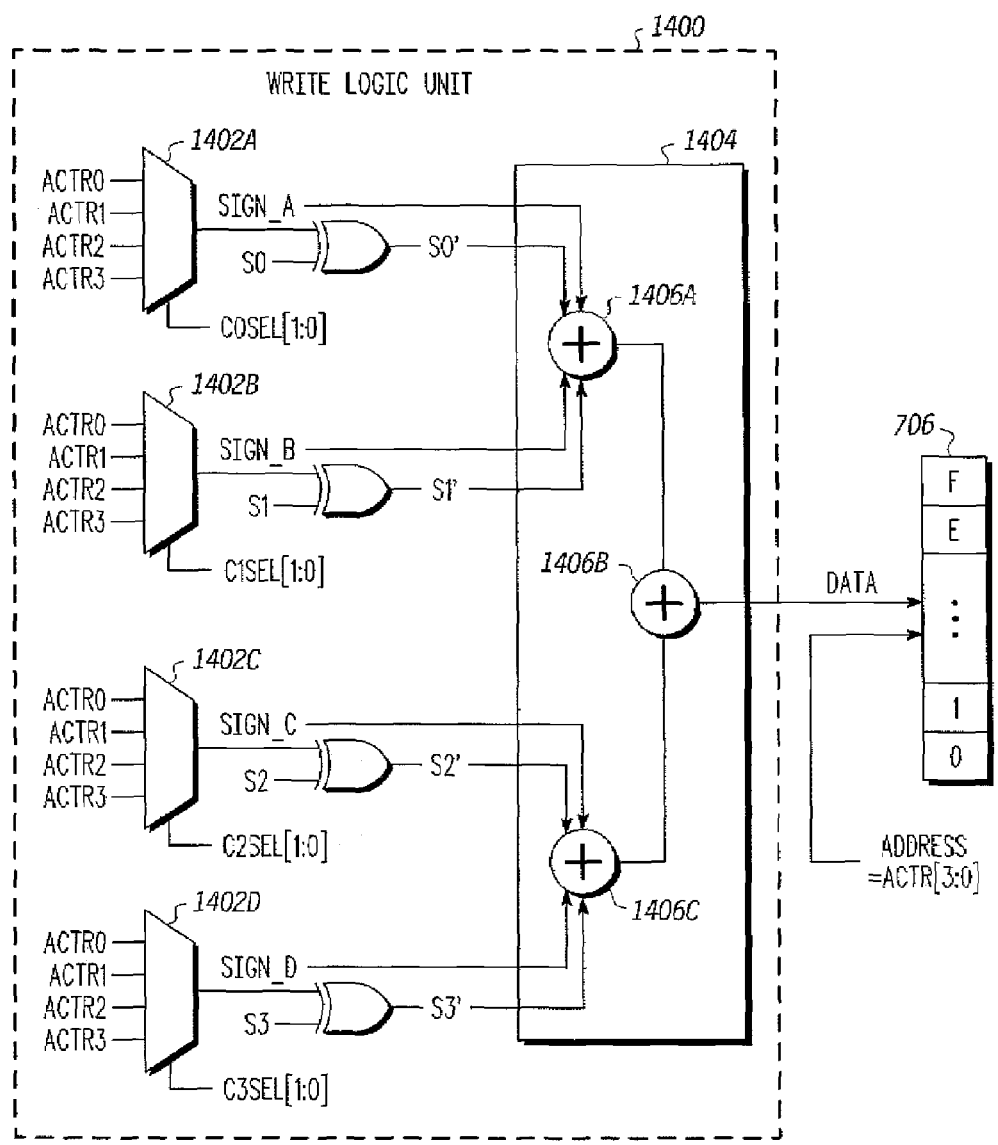
FIG. 14A is a block diagram of a write logic unit to compute and populate $2^d$ branch metrics in accordance with an exemplary embodiment of the present invention.

FIG. 14A is a block diagram illustrating of a write logic unit 1400 that computes and populates 2^d branch metrics in accordance with an embodiment of the present invention. In this embodiment, the write logic unit 1400 is a variant of the write logic unit 1204. The write logic unit 1400 comprises four soft symbol sign generators 1402a, 1402b, 1402c and 1402d, and an adder tree 1404. Quantization of the received data symbol sequence generates the soft symbols. The soft symbol sign generators 1402a, 1402b, 1402c and 1402d receive as inputs actr[3:0] from the address generator 1300, and C0sel[1:0], C1sel[1:0], C2sel[1:0] and C3sel[1:0] from the code word select registers 1006. The soft symbol sign generators 1402a, 1402b, 1402c and 1402d generate the sign bits associated with the respective soft symbols. The generated sign bits are passed along with the soft symbols S0, S1, S2 and S3 to an adder tree 1404 after being processed through XOR gates as S0', S1', S2' and S3', as shown in FIG. 14A.

The adder tree 1404 comprises three adders, 1406a, 1406b, and 1406c. The adder tree 1404 adds the soft symbols, according to the sign bits associated with them at adders 1406a and 1406c. The outputs of the adders 1406a and 1406c are subsequently added by the adder 1406b, to generate the branch metric, which is stored in the first memory 706. The address at which the branch metric value is stored in the first memory 706 is provided by the output actr[3:0] of the address generator 1300.

Figure 14B:
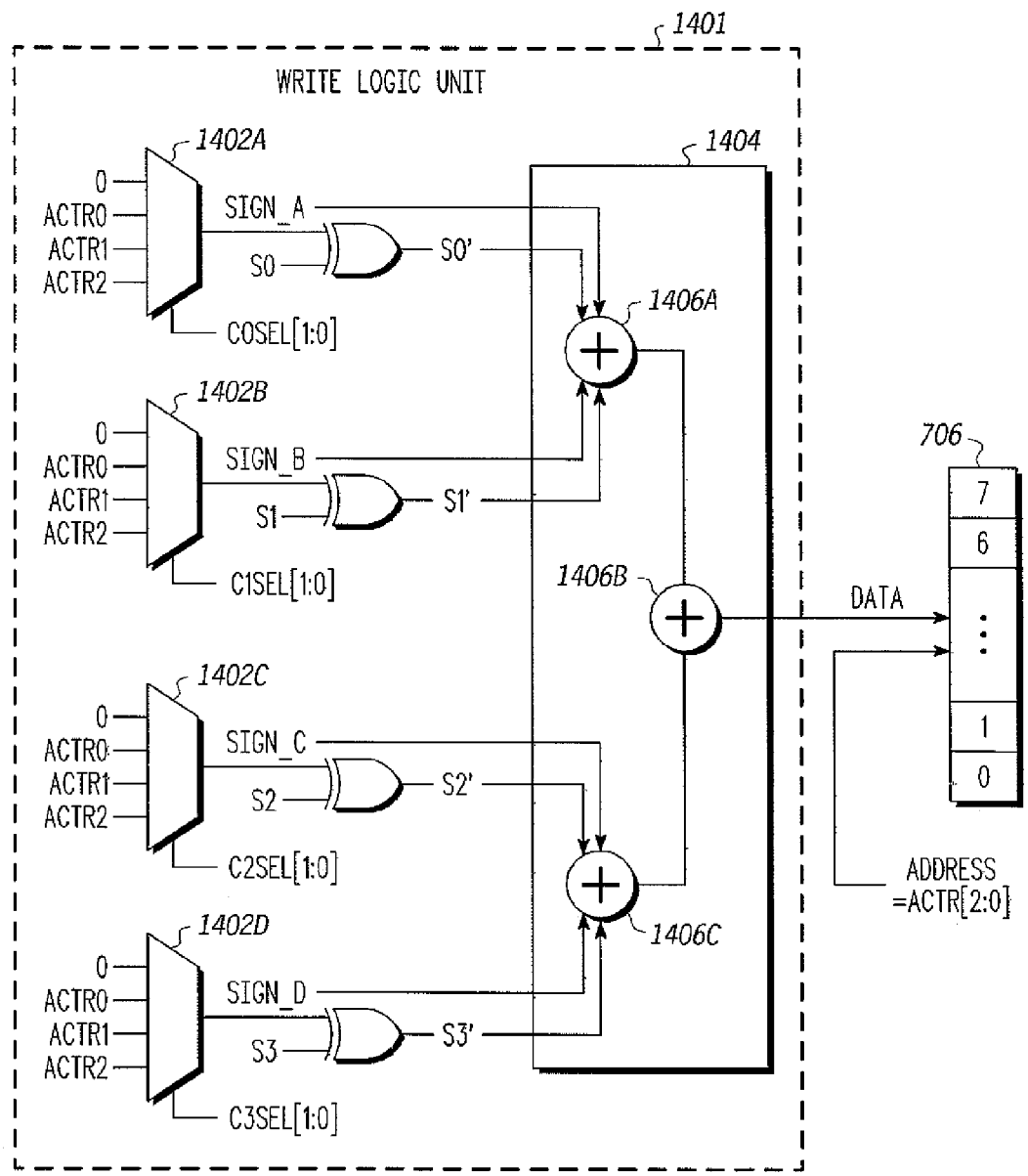
FIG. 14B is a block diagram of a write logic unit to compute and populate $2^{(d-1)}$ branch metrics in accordance with an exemplary embodiment of the present invention.

FIG. 14B is a block diagram of a write logic unit 1401, which is used to compute and populate 2^(d-1) branch metrics in accordance with an embodiment of the present invention. In this embodiment, the write logic unit 1401 is a variant of the write logic unit 1204. The write logic unit 1401 comprises four soft symbol sign generators 1402a, 1402b, 1402c and 1402d, and an adder tree 1404. Quantization of the received data symbol sequence generates the soft symbols. The soft symbol sign generators 1402a, 1402b, 1402c and 1402d receive as inputs actr[2:0] from the address generator 1301, C0sel[1:0], C1sel[1:0], C2sel[1:0] and C3sel[1:0] from the code word select registers 1006. One of the inputs of each of the soft symbol sign generators 1402a, 1402b, 1402c and 1402d is tied to '0'. The soft symbol sign generators 1402a, 1402b, 1402c and 1402d generate the sign bits associated with the respective soft symbols. The generated sign bits are passed along with the soft symbols S0, S1, S2 and S3 to the adder tree 1404 after being processed through XOR gates as S0', S1', S2' and S3'.

The adder tree 1404 comprises three adders, 1406a, 1406b, and 1406c. The adder tree 1404 adds the soft symbols, according to the sign bits associated with them at adders 1406a and 1406c. The outputs of the adders 1406a and 1406c are subsequently added by the adder 1406b, to generate the branch metric, which is stored in the first memory 706. The address at which the branch metric value is stored in the first memory 706 is provided by the output actr[2:0] of the address generator 1301.

Once the computed branch metrics are stored in the first memory 706, they are required to be read back to compute path metrics. To read the stored branch metrics in the first memory 706, a memory read logic unit 1500 is used, which is described in detail in conjunction with FIGS. 15A and 15B.

Figure 15A:
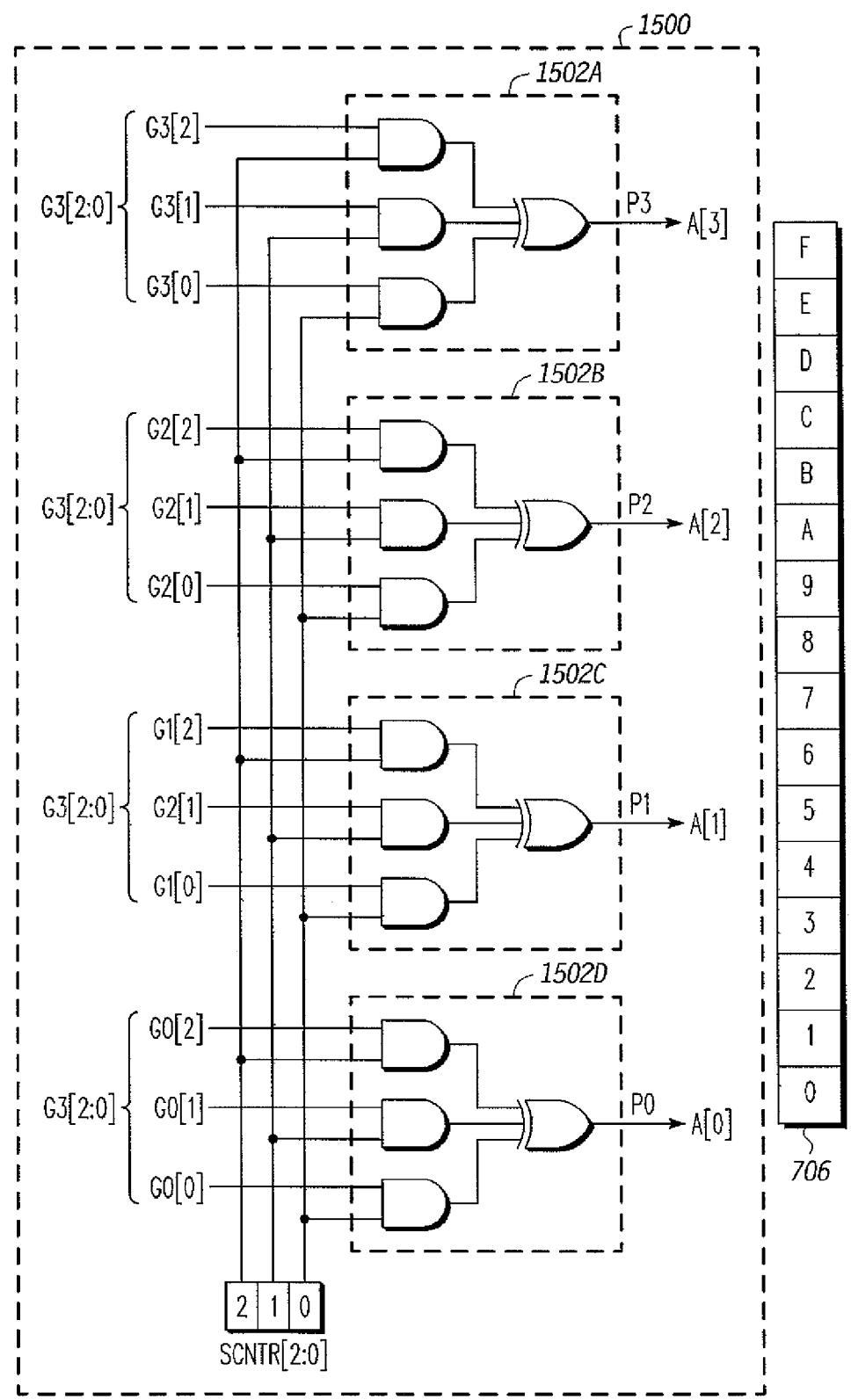
FIG. 15A is a block diagram of a memory read logic unit to read the $2^d$ stored branch metrics in accordance with an exemplary embodiment of the present invention.

FIG. 15A is a block diagram illustrating the memory read logic unit 1500, which reads the 2^d stored branch metrics in accordance with an embodiment of the present invention. For the purpose of illustration, the implementation of this block is shown for the case of ¼ code rate and K=5 constraint length. In this embodiment, the memory read logic 1500 is a variant of the memory read logic 1206. The memory read logic unit 1500 comprises logic circuit blocks 1502a, 1502b 1502c and 1502d. The logic circuit blocks 1502a, 1502b 1502c and 1502d comprise a combination of AND and XOR gates that are connected as shown in FIG. 15A. The inputs of the logic circuit blocks 1502a, 1502b 1502c and 1502d are derived from code word polynomials G3[2:0], G2[2:0], G1[2:0], G0[2:0] and a three-bit counter scntr[2:0]. The outputs of the logic circuit blocks 1502a, 1502b 1502c and 1502d are A[3], A[2], A[1] and A[0] respectively, wherein A[3:0] is the address used for reading the branch metrics from memory locations of the first memory 706 when 2^d branch metrics are stored in the first memory 706.

Figure 15B:
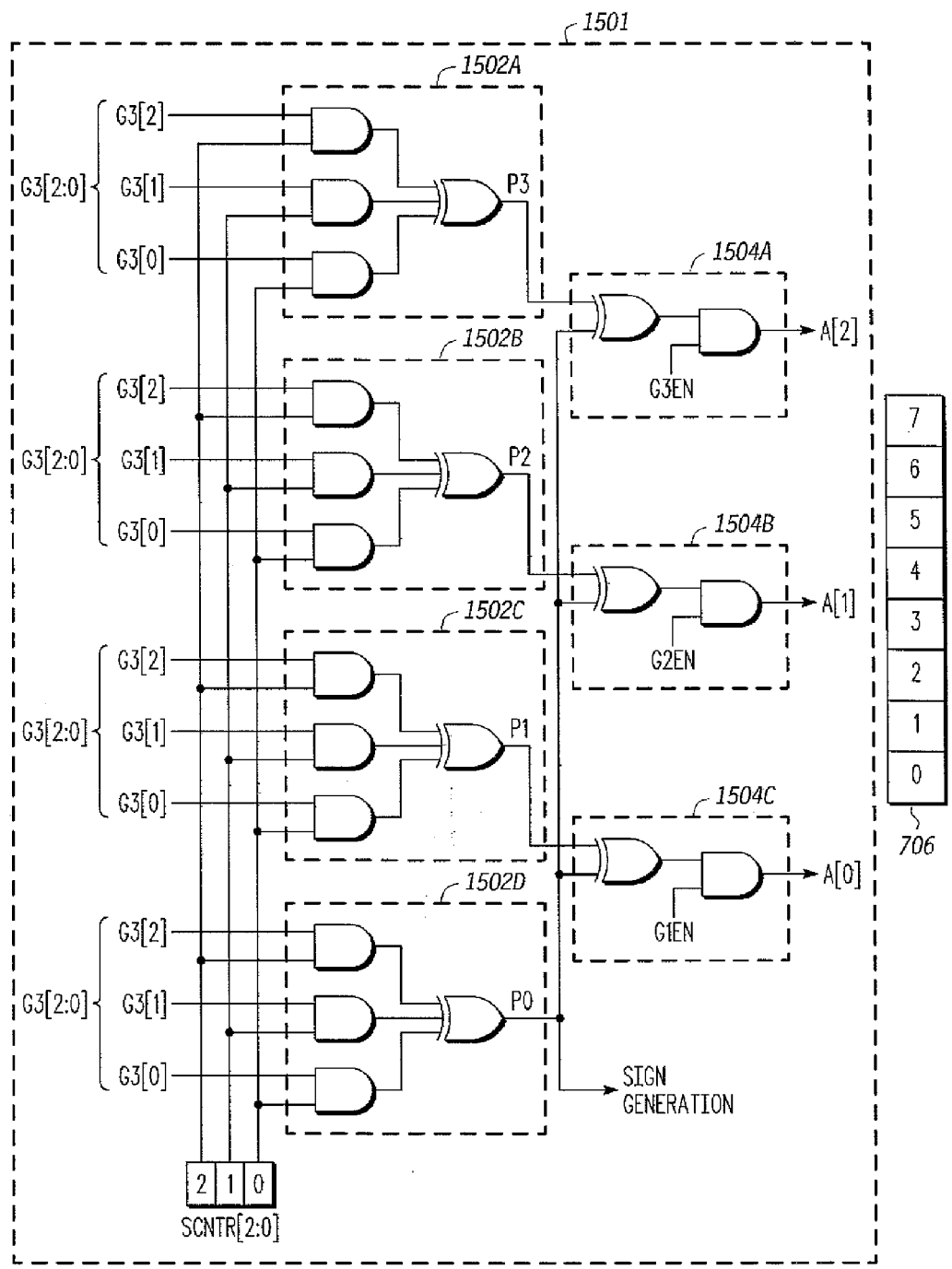
FIG. 15B is a block diagram of a memory read logic unit to read the $2^{(d-1)}$ stored branch metrics in accordance with an exemplary embodiment of the present invention.

FIG. 15B is a block diagram illustrating a memory read logic unit 1501, which reads the 2^(d-1) stored branch metrics, in accordance with an embodiment of the present invention. For the purpose of illustration, the implementation of this block is shown for the case of ¼ code rate and K=5 constraint length. In this embodiment, the memory read logic 1501 is a variant of the memory read logic 1206. The memory read logic unit 1501 comprises logic circuit blocks 1502a, 1502b, 1502c, 1502d and logic blocks 1504a, 1504b and 1504c. The logic circuit blocks 1502a, 1502b, 1502c and 1502d comprise a combination of AND and XOR gates that are connected as shown in FIG. 15B. The inputs of the logic circuit blocks 1502a, 1502b, 1502c and 1502d are derived from code word polynomials G3[2:0], G2[2:0], G1[2:0], G0[2:0] and a two-bit counter scntr[2:0]. The outputs of the logic circuit blocks 1502a, 1502b, 1502c and 1502d are P3, P2, P1 and P0 respectively. The logic blocks 1504a, 1504b and 1504c comprise a combination of AND and XOR gates that are connected as shown in FIG. 15B. The inputs to the logic blocks 1504a, 1504b and 1504c are derived from the outputs of the logic circuit blocks 1502a, 1502, 1502c and 1502d, i.e., P3, P2, P1 and P0. The outputs of the logic blocks 1504a, 1504b and 1504c are A[2], A[1] and A[0] respectively, wherein A[2:0] is the address used for reading the branch metrics from memory locations of the first memory 706 when 2^(d-1) branch metrics are stored in the first memory 706. Also, the output of the logic circuit block 1502d, P0, is used for generating the sign of the branch metric during retrieval of the stored branch metric from the first memory 706. After reading the branch metrics, the branch metrics are used by the path metric unit 708 to compute the path metric.

Figure 16:
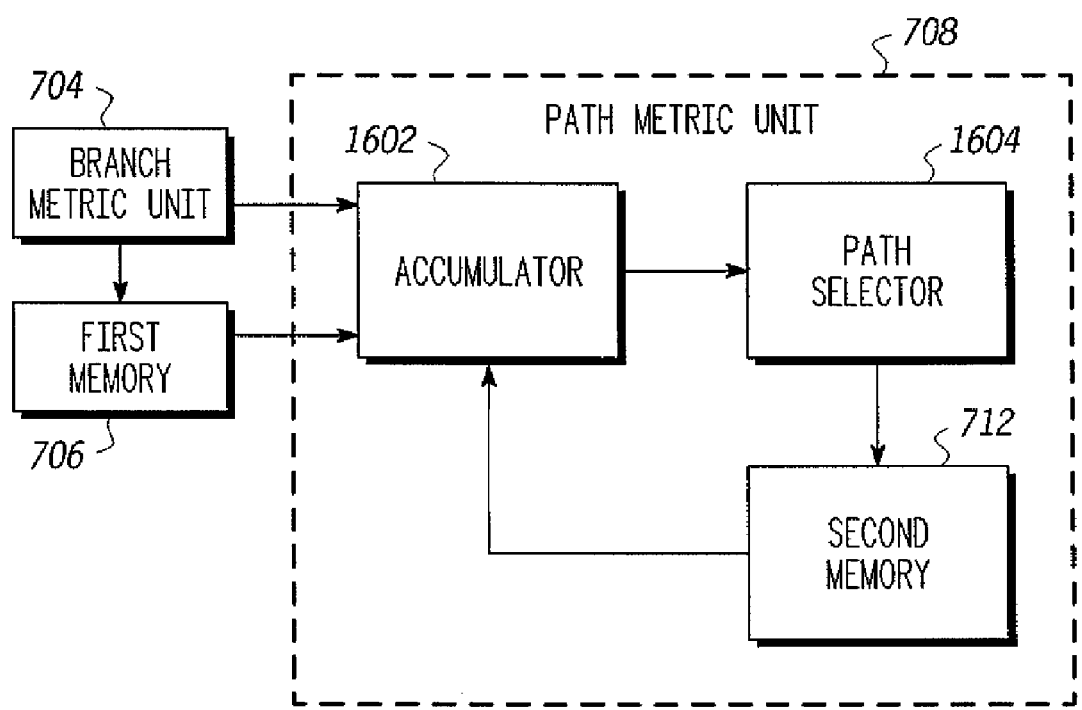
FIG. 16 is a block diagram of a path metric unit in accordance with an exemplary embodiment of the present invention.

FIG. 16 is a block diagram of the path metric unit 708 in accordance with an embodiment of the present invention. The path metric unit 708 comprises an accumulator 1602, a path selector 1604 and second memory 712. The accumulator 1602 is connected to the path selector 1604. The path selector 1604 is connected to the second memory 712, which in turn is connected to the accumulator 1602. The accumulator 1602 enables the generation of path metrics for a trellis state. This involves an add operation of the computed branch metrics for the trellis state to the path metrics for the previous feeding trellis state. The add operation involves the addition or subtraction of the computed branch metric to/from the previous path metric, depending on the sign bit of the computed branch metrics. The path selector 1604 selects the smallest path metric from the computed path metrics for the trellis state. The smallest path metric is used to obtain the optimum path that enables the generation of a decoded data symbol sequence with the probability of a minimum or very low error. The computed path metrics are stored in the second memory 712. The path metric unit 708 is known in the art and its implementation will be apparent to a person skilled in the art.

Referring again to FIG. 7, after computation of the path metrics, the trace back unit 710 generates a set of most likely decoded data symbol sequences. In an embodiment of the present invention, the trace back unit 710 includes a third memory 714 that stores the decision bits generated to compute the decoded data symbol sequence. The trace back unit 710 is known in the art and its implementation will be apparent to a person skilled in the art.

While the method described in the present invention has been illustrated with the hardware Viterbi decoder 702, it will be apparent to one skilled in the art that the present invention can also be embodied in a computer program using a high-level computer language such as C, C++, Java, C# or Visual Basic.

An advantage of the present invention is that it reduces the memory requirements of a Viterbi decoder thereby reducing the die-area required to make the Viterbi decoder. Another advantage is that it reduces the processing time required for decoding. Further, the power requirement of the Viterbi decoder is also reduced.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

The invention claimed is:

1. A method for decoding a data symbol sequence previously encoded using one or more unique code word polynomials, wherein the encoding process uses at least one unique code word polynomial more than once, the method comprising the steps of:

computing a set of unique branch metrics based on the data symbol sequence using the unique code word polynomials, wherein the number of branch metrics computed is $2^{d-1}$, where d is the number of unique code word polynomials;

storing the computed set of unique branch metrics;

calculating path metrics and decision bits based on the stored set of unique branch metrics and path metrict of previous feeding state; and generating a decoded data symbol sequence based on the computed decision bits, and wherein the computing the set of $2^{d-1}$ unique branch metrics step comprises:

computing a set of $2^d$ branch metrics based on the data symbol sequence using the unique code word polynomials;

identifying complementary branch metric pairs from amongst the computed set of $2^d$ unique branch metrics; and selecting one branch metric from each identified complementary branch metric pair.

2. The decoding method of claim 1, wherein the calculating the path metrics step comprises:

adding the computed branch metrics for a state to the path metrics for the previous feeding state; and storing the accumulated path metric.

3. The decoding method of claim 2, wherein the adding the computed branch metrics step further comprises:

determining a sign value of the computed branch metric; and performing one of addition and subtraction of the computed branch metric based on the sign value.

4. The decoding method of claim 1, wherein the data symbol sequence is encoded using convolutional coding.

5. A method for decoding a data symbol sequence encoded previously using convolutional coding, the convolutional coding being done using one or more unique code word polynomials, wherein the encoding process uses at least one unique code word polynomial more than once, the method comprising:

computing a set of unique branch metrics based on the data symbol sequence using the unique code word polynomials, wherein the number of branch metrics computed is $2^{d-1}$, where d is the number of unique code word polynomials, the step comprising:

computing a set of unique branch metrics based on the data symbol sequence using the unique code word polynomials, wherein the number of branch metrics computed is $2^d$, where d is the number of unique code polynomials;

identifying complementary branch metric pairs from amongst the computed set of unique branch metrics;

selecting one branch metric from each identified complementary branch metrics pair, such that a set of $2^{d-1}$ unique branch metrics is selected;

storing the selected branch metrics;

calculating path metrics and decision bits based on the stored branch metrics and path metrics of previous feeding state; and generating a decoded data symbol sequence based on the computed decision bits.

6. A computer readable memory including a computer program for decoding a data symbol sequence previously encoded using convolutional coding, the convolutional coding being done using one or more unique code word polynomials, the encoding process using at least one unique code word polynomial more than once, the computer program performing:

computing a set of unique branch metrics based on the data symbol sequence using the unique code word polynomials, wherein the number of branch metrics computed is $2^{d-1}$, where d is the number of unique code word polynomials, the step comprising:

computing a set of unique branch metrics based on the data symbol sequence using the unique code word polynomials, wherein the number of branch metrics computed is $2^{d-1}$, where d is the number of unique code polynomials;

identifying complementary branch metric pairs from amongst the computed set of unique branch metrics;

selecting one branch metric from each identified complementary branch metrics pair, such that a set of $2^{d-1}$ unique branch metrics is selected;

storing the selected branch metrics;

calculating path metrics and decision bits based on the stored set of unique branch metrics and path metrics of previous feeding state; and generating a decoded data symbol sequence based on the computed decision bits.

* * * * *